US012601982B2

(12) United States Patent
Chiu et al.

(10) Patent No.: US 12,601,982 B2
(45) Date of Patent: Apr. 14, 2026

(54) WORKPIECE CONTAINER SYSTEM

(71) Applicant: GUDENG PRECISION INDUSTRIAL CO., LTD, New Taipei (TW)

(72) Inventors: Ming-Chien Chiu, New Taipei (TW); Chia-Ho Chuang, New Taipei (TW); Hsin-Min Hsueh, New Taipei (TW); Hsing-Min Wen, New Taipei (TW); Shu-Hung Lin, New Taipei (TW)

(73) Assignee: GUDENG PRECISION INDUSTRIAL CO., LTD, New Taipei (TW)

( * ) Notice: Subject to any disclaimer, the term of this patent is extended or adjusted under 35 U.S.C. 154(b) by 743 days.

(21) Appl. No.: 17/168,207

(22) Filed: Feb. 5, 2021

(65) Prior Publication Data

US 2022/0100106 A1 Mar. 31, 2022

(30) Foreign Application Priority Data

Sep. 30, 2020 (TW) ................................. 109134304

(51) Int. Cl.
G03F 7/00 (2006.01)
B01D 53/26 (2006.01)
B01D 71/02 (2006.01)

(52) U.S. Cl.
CPC ....... G03F 7/70975 (2013.01); B01D 53/268 (2013.01); B01D 71/02232 (2022.08)

(58) Field of Classification Search
CPC ...................... G03F 7/70975; H01L 21/67359
See application file for complete search history.

(56) References Cited

U.S. PATENT DOCUMENTS

| | | | |
|---|---|---|---|
| 2003/0218728 A1 | 11/2003 | del Puerto et al. | |
| 2006/0260978 A1* | 11/2006 | Gregerson | .......... G03F 7/70741 |
| | | | 206/710 |
| 2009/0301917 A1* | 12/2009 | Kolbow | ............ H01L 21/67359 |
| | | | 206/454 |
| 2012/0037522 A1* | 2/2012 | Chiu | ................. H01L 21/67359 |
| | | | 206/316.1 |
| 2018/0210349 A1* | 7/2018 | Hsueh | ............... H01L 21/67353 |

(Continued)

FOREIGN PATENT DOCUMENTS

| | | |
|---|---|---|
| CN | 101726987 A | 6/2010 |
| CN | 204871749 U | 12/2015 |

(Continued)

*Primary Examiner* — Ernesto A Grano
*Assistant Examiner* — Symren K Sanghera
(74) *Attorney, Agent, or Firm* — ScienBiziP, P.C.

(57) ABSTRACT

The instant disclosure discloses a workpiece container system comprising a storage assembly that comprises a seat member. The seat member has a storage portion that defines a longitudinal axis through a geometric center region thereof, provided with a workpiece receiving region that encompasses the geometric center region and configured to receive a workpiece. The seat member has a pair of flank portions arranged on opposite sides of the storage portion along the longitudinal axis, each having a thickness thinner than that of the storage portion. A diffuse inducing component is provided on the storage portion in the workpiece receiving region yet offsets the geometric center region thereof.

17 Claims, 14 Drawing Sheets

(56) References Cited

U.S. PATENT DOCUMENTS

| | | |
|---|---|---|
| 2020/0211876 A1 | 7/2020 | Raschke et al. |
| 2021/0300635 A1* | 9/2021 | Chiu ................. H01L 21/67386 |
| 2022/0404696 A1* | 12/2022 | Wang ................ H01L 21/67376 |

FOREIGN PATENT DOCUMENTS

| | | | |
|---|---|---|---|
| CN | 108529012 A | 9/2018 | |
| EP | 2453310 B1 | 12/2015 | |
| JP | 2003257852 A | 9/2003 | |
| JP | 2004071729 A | 3/2004 | |
| KR | 10-2004-0002437 A | 1/2004 | |
| KR | 10-2020-0020981 A | 2/2020 | |
| TW | 201532909 A * | 9/2015 | |
| WO | 2007074757 A1 | 7/2007 | |
| WO | 2015082876 A1 | 6/2015 | |
| WO | WO-2018044678 A1 * | 3/2018 | .............. G03F 1/66 |

* cited by examiner

1327d

WORKPIECE CONTAINER SYSTEM

CROSS-REFERENCE TO RELATED APPLICATIONS

This application claims the benefit of Taiwan Patent Application No. 109134304 filed on Sep. 30, 2020, which is hereby incorporated by reference herein and made a part of specification.

FIELD

This present disclosure relates to container for storage, transport, shipping and processing of fragile objects such as photomask, reticle, and wafer, and, in particular, to retaining system for storage, transport, shipping, and processing of a reticle for extreme ultraviolet (EUV) lithography process.

BACKGROUND

In semiconductor industry, workpiece containers (e.g., photomask/reticle retainer) have evolved with the heightened precision requirements of the payload thereof, in order to meet the demand for increased level of workpiece protection from potential ambient hazards.

For example, newer generation reticle retainers are sometimes provided with a dual-pod configuration that includes a storage assembly (e.g., an inner pot unit) for receiving/storing a reticle and a transport assembly (e.g., an outer pot unit) for accommodating/transporting the storage assembly. During transportation, a reticle may be packed inside the storage assembly. For storage purposes, a container system that houses a reticle therein may be transported (e.g., by a robot under an atmosphere environment) to an outer pod opener. Thereafter, the transport assembly can be opened by the opener to allow retrieval of the storage assembly therefrom. Then, the inner pod may be carried (e.g., by a robot under a vacuum environment) to a vacuum reticle library and be stored therein. For executing a lithography process, the storage assembly may be opened upon arriving at a designated position inside an exposure apparatus prior to a subsequent exposure process that employs the contained reticle.

However, when using the container system to store/transport a workpiece, there may be particulate contaminants, gas-phase contaminants (e.g., outgas or humidity), or airborne molecular contaminants (AMC) inside the storage assembly. The contaminants may adversely impact the received workpiece. There is therefore a need for a contamination control mechanism for the container system.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
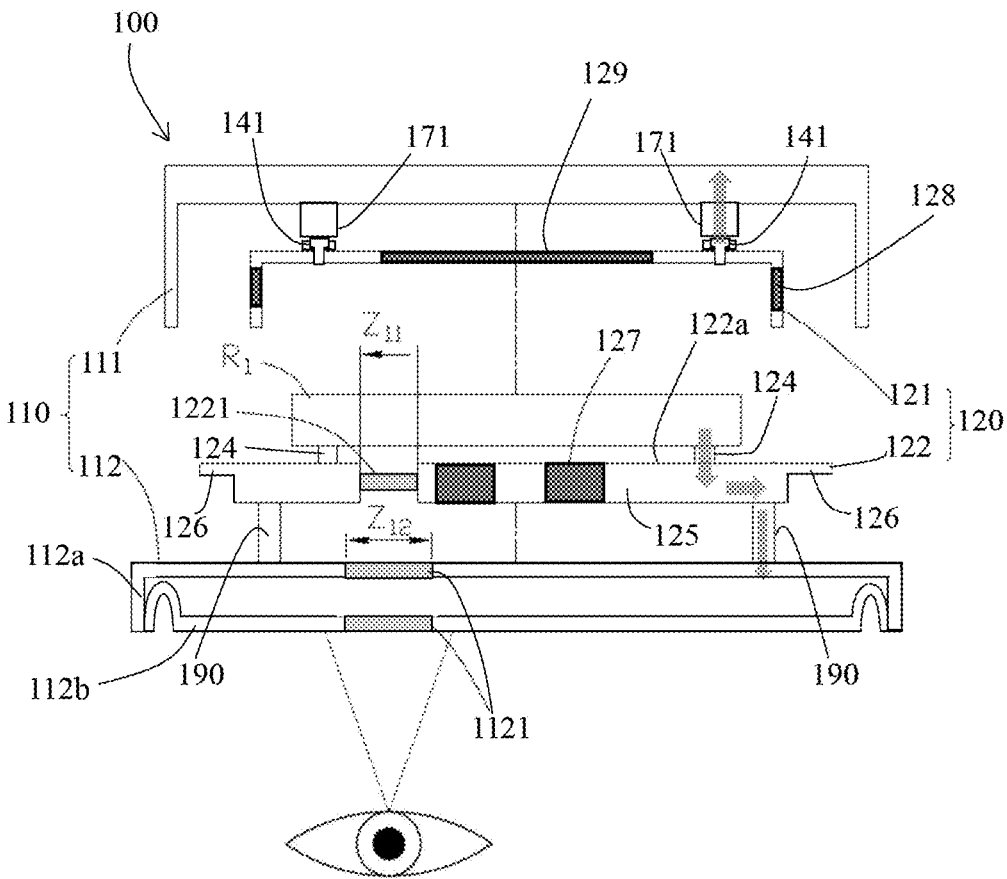
FIG. 1 illustrates a schematic cross-sectional view of a workpiece container system in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 13. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 illustrates a schematic cross-sectional view of a workpiece container system in accordance with some embodiments of the instant disclosure. For illustrational simplicity and clarity, some detail/sub components of the exemplary device are not explicitly labeled/shown in the instant figure.

Referring to FIG. 1, the exemplary workpiece container system 100 comprises an inner pod (e.g., storage assembly 120) configured to store a workpiece (e.g., a reticle) therein and an outer pod (e.g., a transport assembly 110) configured to house the storage assembly 120.

In the illustrated embodiment, the storage assembly 120 comprises a seat member 122 and a seat cover 121 configured to engage the seat member 122, so as to cooperatively form an interior volume upon enclosure for accommodating the workpiece (e.g., reticle $R_1$).

The exemplary seat member 122 is configured to receive/support the stored workpiece. The seat member 122 includes a storage portion 125 provided with a workpiece receiving surface 122a for receiving the workpiece. In the illustrated embodiment, the seat member 122 is further provided with a supporting element (e.g., supporting post 124) arranged on a top surface of the storage portion 125 for supporting the reticle $R_1$. The seat member 122 is further configured to be conveyed from one chamber to another by a robot arm of a semiconductor apparatus. For example, the seat member 122 further comprises a pair of flank portions 126 arranged on opposite sides of the storage portion 125. In the current cut view, the flank portion 126 is provided with a thickness thinner than the storage portion 125. Such thickness difference generates a step profile near an edge portion of the seat member 122. The pair of stepped profiles is configured to serve as contact interfaces with a robot arm having a fork-like structure. Such arrangement allows the seat member 122 to be laterally retained and vertically supported by the fork-like arm.

In some scenarios, the stored workpiece may be a semiconductor substrate (e.g. an extreme ultraviolet lithography reticle $R_1$). It is essential that the functional surface of the reticle $R_1$ (i.e. the downwardly facing surface that has a mask layout pattern defined thereon) be kept free of contaminants so as to prevent damage to the surface or distortion to the image projected onto a photoresist layer during lithography process.

To protect the sensitive and fragile workpiece from particles/contaminants outside the storage assembly 120, the engagement between the seat member 122 and the seat cover 121 may be provided with a certain degree of air tightness. Moreover, in order to provide thorough protection to its sensitive and fragile content, the seat cover 121 and the seat member 122 may be provided with electromagnetic interference (EMI) shielding property. Suitable material for providing EMI shielding capability may include conductive material such as metal. In some embodiments, the seat member 122 and the seat cover 121 are substantially made of metal, such as aluminum. In some embodiments, surface treatments such as metallic coating (such as copper or gold), hydrophobic and/or hydrophilic treatment may be further provided over selective regions of the surface of the storage assembly 120.

Besides the aforementioned particulate contaminants, there may be gas-phase contaminants or airborne molecular contaminants (AMC) inside the sealed storage assembly. Even the storage assembly can be sealingly engaged, there is the possibility of air entering into the system when the workpiece is removed from and replaced within the container system during processing. For example, moisture in the air can be found inside the storage assembly 120. At a suitable dew point temperature, the some of the moisture will condense out of the air and may get deposited onto the reticle $R_1$. Other sources of gas-phase or vapor contamination (such as $NH_3$ (ammonia) and $SO_2$ (sulphur dioxide)) are solvent residues resulting from reticle/pod cleaning operations during the photomask lifecycle. Some of these chemicals and the moisture may facilitate haze formation on a reticle that is made of quartz. Haze formation and/or water vapor condensing onto the patterned surface of the reticle $R_1$ may interfere with the optics, which may result in distortion of a pattern transferred on a semiconductor wafer during a lithography process.

The exemplary inner pod 120 is provided with one or more diffuse inducing component (e.g., components 127, 128, and 129) that allows reduction or removal of the gas-phase contaminants or airborne molecular contaminants from the inner pod 120. For instance, the provision of the diffuse inducing components allows diffusion of moisture from inside the storage assembly to the outside ambient (e.g., when humidity inside the storage assembly is substantially greater than that in the ambient, or when the system is purged with clean dry air).

The interior moisture may diffuse out of the inner pod 120 via the one or more diffuse inducing component. As such, the water deposition or haze formation on the reticle can be alleviated. In some embodiments, the diffuse inducing components may include a plurality of channels/ports/through holes formed on the cover/base of the storage assembly that enables fluid communication between the interior and exterior of the inner pod. In some embodiments, the diffuse inducing components may further include a filter element that is configured to prevent particulate contaminants from passing there-through.

While the top-facing surface of the cover unit of the storage assembly 120 (e.g., cover member 121) is a convenient location for an upper diffuse inducing component (e.g., diffuse inducing component 129 arranged above the received workpiece), a top-mounted diffusing member along may not provide sufficient level of humidity extraction efficiency in certain applications (particularly at regions around the bottom face of the workpiece).

For instance, in some embodiments, a separation between top surface of the seat member 122 and the bottom face of the received workpiece is no more than 0.3 mm upon assembly. A narrow separation may not favor air-flow inducement under the workpiece. As such, there may be difficulties for the gas-phase contaminants such as moisture under the workpiece to travel over the workpiece toward the top-mounted diffusing member.

To further boost diffusing efficiency, the seat member 122 of the exemplary embodiment is provided with a lower diffuse inducing component 127 arranged below the workpiece. Such arrangement facilitates diffusion of moisture under the workpiece for effective extraction.

In the illustrated embodiment, the transport assembly 110 comprises an outer base 112 configured to receive the seat member 122 and an outer cover 111 configured to engage the outer base 112 (and cover the storage assembly 120). In some embodiments, either one or both of the outer base 112 and the outer cover 111 may be provided with static charge dissipation property to allow the release of electrical charge accumulated on the stored workpiece or the storage assembly. For instance, in some embodiments, the outer pod 110 may be constructed from polymer material mixed with conductive fibers. In some embodiments, either one or both of the outer cover 111 and outer base 112 are made from carbon fibers embedded resin material.

In some embodiment, the outer pod 110 may be further provided with one or more gas inlet port (not shown) configured to allow the entrance of clean dry air (CDA), extra CDA or dry inert gases (such as nitrogen) from a source. In some embodiment, the outer pod 110 may be further provided with one or more gas outlet port configured to allow reduction or removal of the gas inside the outer pod 110. In some embodiments, the gas inlet and/or outlet port may be further provided with a valve configured to control the flow inside the ports.

In some embodiments, a pressing unit (e.g., hold down pin 141) may be provided on a top surface of the seat cover 121 for pressing/holding the workpiece. The exemplary outer pod 110 is further provided with a pushing element 171 arranged in correspondence with the hold down pin 141 of the storage assembly 120. When the outer cover 111 is coupled to the outer base 112, the pushing element 171 pushes the hold down pin 141 to press/hold the workpiece $R_1$, thereby restraining movement of the workpiece upon receipt.

In the illustrated embodiment, the pushing element 171 is configured to push the hold down pin 141 at an exposed portion thereof (e.g., a top surface thereof). In the illustrated embodiment, a width of a projected area of the exposed portion of the pressure receiving surface is smaller than that of the pushing element.

In some embodiments, the pushing element 171 and the hold down pins 141 are further provided with charge dissipation property. Accordingly, when the outer cover 111 is coupled to the outer base 112, the pushing element 171 pushes the hold down pin 141 to press the workpiece $R_1$ and establishes a charge dissipation paths (indicated by shaded arrows in the instant figure) from the received workpiece $R_1$, through the hold down pin 141 and the pushing element 171, to the outer cover 111. In some operation scenarios, the outer cover 111 may be grounded, so as to allow accumulated charges on the received workpiece $R_1$ to be dissipated through the charge dissipation path to the ground. The material for the hold down pin 141 may comprise conductive or static dissipative material, thereby making the hold down pin 141 part of the charge dissipating path to enable grounding there-though. In some embodiments, the hold down pin 141 and the pushing element 171 are provided with surface resistance value in a range from about $10^6$ to $10^{11}\Omega$. In some embodiments, the hold down pin 141 and the pushing element 171 are provided with surface resistance value less than about $10^5\Omega$.

In the illustrated embodiment, the outer pod 110 further includes a supporting structure 190 arranged on the outer base 112 configured to support the storage assembly 120. The supporting structures 190 may be integrally formed with or be mounted on the outer base 112. In some embodiments, the supporting elements 124 of the storage assembly 120 and the supporting structure 190 of the outer pod 110 are further provided with charge dissipation property. Accordingly, when the outer cover 111 is coupled to the outer base 112 (and thus the supporting elements 124 on the seat member 122 establishes contact with the workpiece $R_1$), a charge dissipation path (indicated by shaded arrows in the instant figure) may be formed from the received workpiece $R_1$, through the supporting element 124, the seat member 122 and the supporting structure 190, to the outer base 112. In some embodiments, the supporting elements 124 and the supporting structure 190 have surface resistance value in a range from about $10^6$ to $10^{11}\Omega$. In some embodiments, the supporting elements 124 and the supporting structure 190 have surface resistance value less than about $10^5\Omega$.

As shown in FIG. 1, the exemplary system has a first observable zone $Z_{11}$ defined in the workpiece accommodating region 122a of the seat member 122 to allow observation of the reticle $R_1$. In some embodiment, the first observation zone $Z_{11}$ may be provided with a window that comprises a signal transmissive structure (e.g., an opening or a signal transmissive member). For example, the exemplary seat member 122 includes an inner optical member 1221 arranged in the first observable zone $Z_{11}$. In some embodiments, the inner optical member 1221 may be made of a signal transmissive material with respect to infrared light, visible light, or ultraviolet signal. Suitable material of the inner optical member 1221 may include glass (e.g., quartz glass), acrylic, transparent plastic, or other comparable materials. In the illustrated embodiment, the inner optical member 1221 may include a piece of quartz glass embeddedly arranged in the seat member 122 (in the workpiece accommodating region 122a).

In the illustrated embodiment, the first observable zone $Z_{11}$ is correspondingly designed to allow observation of an identification feature (e.g., a 1-D or 2-D bar code) of the reticle $R_1$ upon receipt of the reticle $R_1$ (not explicitly shown in the schematic illustration). In some embodiments, the identification feature of the reticle $R_1$ is formed on a window-facing surface thereof and viewable from the first observable zone $Z_{11}$.

In the illustrated embodiment, the outer base 112 has a second observable zone $Z_{12}$ defined thereon. The second observable zone $Z_{12}$ is arranged to be observably aligned to the first observable zone $Z_{11}$ of the storage assembly 120. As such, quick visual identification or optical confirmation (such as the condition of the reticle $R_1$ and the identification) of the reticle $R_1$ retained in the container system 100 may be achieved by optical scanning through the second observable zone $Z_{12}$ and first observable zone $Z_{11}$ without the need to open up the outer pod. Accordingly, the frequency of pod opening may be reduced during semiconductor fabrication process, which in turn minimizes exposure of the sensitive precision workpiece to the potentially hazardous ambient factors.

In the illustrated embodiment, outer base 112 has a hollow body comprising an upper deck 112a configured to support the seat member 122 and a lower deck 112b opposite to the upper deck 112a. In some embodiments, both of the exemplary upper deck 112a and the lower deck 112b may be provided with a structure of substantially horizontal plate. The exemplary lower deck 112b is configured to seal the upper deck 112a. In some embodiments, the lower deck 112b and the upper deck 112a are integrally formed. The exemplary second observable zone $Z_{12}$ is provided with a window that includes two overlapping signal transmissive structure (e.g., outer optical members 1121) respectively arranged in the upper and the lower deck 112a, 112b.

In some embodiments, the outer optical member 1121 embedded in the upper deck 112a and/or the lower deck 112b may be made of a signal transmissive material with respect to infrared light, visible light, or ultraviolet. Suitable material of the outer optical member 1121 may include glass (e.g., quartz glass), acrylic, transparent plastic, or comparable materials. In some embodiments, a transmittance value of the outer optical member 1121 is greater than 80% with respect to optical signals in one or more of the abovementioned spectrum ranges. Depending on specific applicational requirement, in some embodiments, the optical members (e.g., outer optical members and/or inner optical member) may include concave/convex surface.

In some embodiments, the inner optical member 1221 has a lower reflectance value than the outer optical member 1121 with respect to wavelength in a range between 600 nm to 950 nm. In some embodiments, the corresponding wavelength range for the optical members may be in a range of about 630 nm to 930 nm. In some embodiments, a reflectance value of the outer optical member 1121 with respect to the abovementioned wavelength range may be less than 15%. In some embodiments, a reflectance value of the inner optical member 1221 with respect to the abovementioned range of wavelength may be less than 0.5%. In some embodiments, the inner optical member 1221 may be further provided with an anti-reflection coating. In some embodiments, the inner optical member 1221 may be further provided with a layer having EMI shielding property.

In some embodiments where dust-resisting and/or dust-proofing requirement is stringent, the outer optical member 1121 in the second observable zone $Z_{12}$ of the outer base 112 may be provided with similar sealing mechanism. However, in applications where inner sealing alone is sufficient, the outer optical member 1121 may be constructed without utilizing sealing mechanism for reduction of structural complexity, weight, and cost concerns.

In some embodiments, the entire bottom face of the outer base may be designed to act as the second observation zone. For example, an outer optical member may occupy the entire bottom of the outer base.

Figure 2:
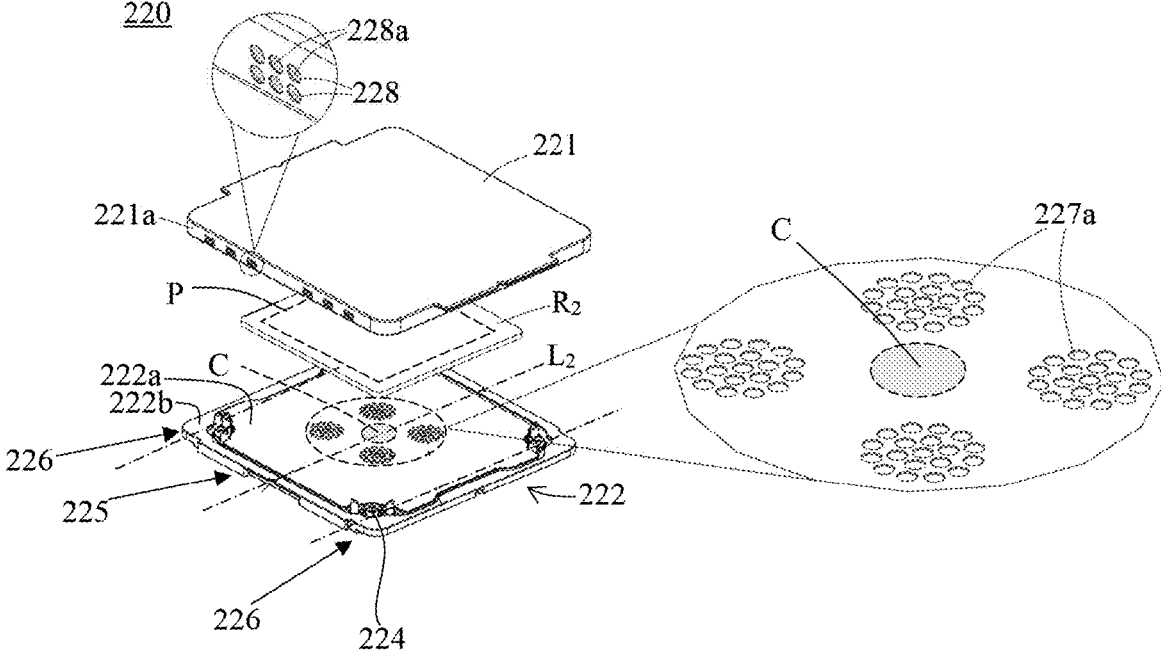
FIG. 2 illustrates an isometric view of a workpiece container system in accordance with some embodiment of the instant disclosure.

FIG. 2 illustrates an isometric view of a workpiece container system in accordance with some embodiment of the instant disclosure.

Referring to FIG. 2, the exemplary storage assembly 220 comprises a seat member 222 and a seat cover 221 configured to cooperatively form an interior volume for accommodating a substrate (e.g., reticle $R_2$). In the illustrated embodiment, the seat member 222 has a substantially rectangular profile that defines a longitudinal axis $L_2$ through a geometric center region C thereof. The seat member 222 comprises a storage portion 225 and a pair of flank portions 226 that extend along the longitudinal axis $L_2$. The exemplary flank portions 226 have a reduced thickness (i.e., thinner than that of the storage portion 225). In the illustrated embodiment, a top face of exemplary seat member 222 defines a workpiece accommodating region and a periphery region 222b that surrounds the workpiece accommodating region. Suitable material and/or coatings for the seat cover 221 and the seat member 222 may be comparable to those described in the aforementioned embodiments.

In some embodiments, the seat cover 221 may be configured to establish pressing engagement with the seat member 222 through pressure from an outer pod (e.g., transport assembly 120) upon enclosure. For example, a pressing engagement between the seat cover 221 and the seat member 222 is formed through a substantially planar metal to metal interface. In the illustrated embodiment, the metal interface is established on the periphery region 222b of the seat member 222. In general, the pressing engagement establishes a sealing enclosure that prevents dust and humidity from entering into the interior volume through the contact interface between the upper and lower members of the storage assembly 220. In some embodiments, either or both of the seat cover and the seat member may be provided with additional sealing element (e.g., sealing gasket or O-ring) at the respective engaging interface region to further enhance interdicting capability against ambient contamination.

A lower diffuse inducing component is provided on the storage portion 225 of the seat member 222 in the workpiece receiving region, and is configured to allow extraction of gas-phase contaminants under the workpiece $R_2$ from the interior of the storage assembly. It is expected that the gas-phase contaminants under a pattern area P of the received reticle $R_2$ can be efficiently reduced. In the illustrated embodiment, the lower diffuse inducing component is formed with a plurality of diffuse port assemblies 227a arranged within a planar projection of the pattern region P of the workpiece $R_2$.

The placement location for the diffuse port assemblies 227a on the storage portion 225 may take various factors into consideration, such as weight distribution, structural integrity, and overall weight limit of the device components. For one thing, the exemplary diffuse port assemblies 227a are placed in the workpiece receiving region over the seat member 222 yet offset the geometric center region (e.g., region C) thereof. The off-center placement of the diffuse port assembly allows the material at the central region to be left intact, whereby the overall structural integrity of the seat member 222 may be better maintained (e.g., against thermal expansion, warpage during machine tooling, etc.), and the mass distribution may be kept closer toward the geometric center thereof for better overall balance. In addition, the location of the exemplary diffuse port assembly evades other pre-designated functional components, such as windows and substrate supporting mechanisms. In some embodiments, the geometric center region C is provided with a width/radius form about 25 to 30 mm.

In the illustrated embodiment, a side wall 221a of the seat cover 221 is provided with a plurality of air flow channels 228 and at least one filter member 228a arranged to cover the air flow channels 228.

After the container system is cleaned (e.g., washed), there may be water residual on the surface thereof. The water residual may attract dirt thus increase the possibility of contamination of the received workpiece. By changing the surface characteristics of the storage assembly, the storage assembly may be dried more easily after cleaning. Accordingly, downtime due to baking/drying processes after cleansing may be reduced. Moreover, surface treatment (e.g., hydrophobic treatment) of the storage assembly 220 may reduce stiction of fine dusts and make it easier to wash them away, thereby increasing the dust-proofing ability of the storage assembly.

The storage assembly (e.g., storage assembly 220) may be divided into different regions, on which different surface treatments of hydrophilicity and hydrophobicity are applied. In some embodiments, one or both the seat cover 221 and the seat member 222 may be surface-treated, either partially/selectively or in its entirety. For example, in some embodiments, the interior surface (e.g., the inwardly exposed surface upon closure of the inner pod) of the seat cover 221 and the seat member 222 may receive hydrophilic treatment (e.g., at regions that correspond to the normal projection of a received workpiece), while the remaining regions be left none-treated or hydrophobic-treated.

In some embodiments, the workpiece accommodating region 222a of the seat member 222 is treated with a first type treatment. In some embodiments, the first type treatment area comprises a hydrophilic treatment area. Upon occurrence of water condensation due to ambient condition changes (e.g., equipment malfunction), water droplets occurred in the workpiece accommodating region 222a (e.g., the inner central region under the normal projection of a received reticle) may generate a smaller wetting angle (which translates to a lower overall droplet height), thus reducing the likelihood of condensation contact with a stored reticle.

In some embodiments, the interior surface of the seat member is further treated with a second type surface treatment. For instance, the seat member 222 includes a second type treatment area (e.g., the periphery area) arranged around the workpiece accommodating region 222a. In some embodiments, the second type treatment area comprises a hydrophobic treatment area. The seat member 222 provided with the hydrophobic treatment may be dried more easily after cleaning. In some embodiments, the outer surface (e.g., the outwardly exposed surface upon closure of the inner pod) of the seat member 222 may also be treated with hydrophobic treatment.

In some embodiments, the seat member 222 and the seat cover 221 are substantially made of metal. Furthermore, the hydrophobic treatment area is provided with a surface resistance value less than about $10^{11}\Omega$. For example, the hydrophobic coating over the storage assembly may be kept below 1 um to maintain static charge dissipating capability. In some embodiments, a hydrophobic layer over the hydrophobic treatment area has a thickness of less than about 1 um.

Figure 3:
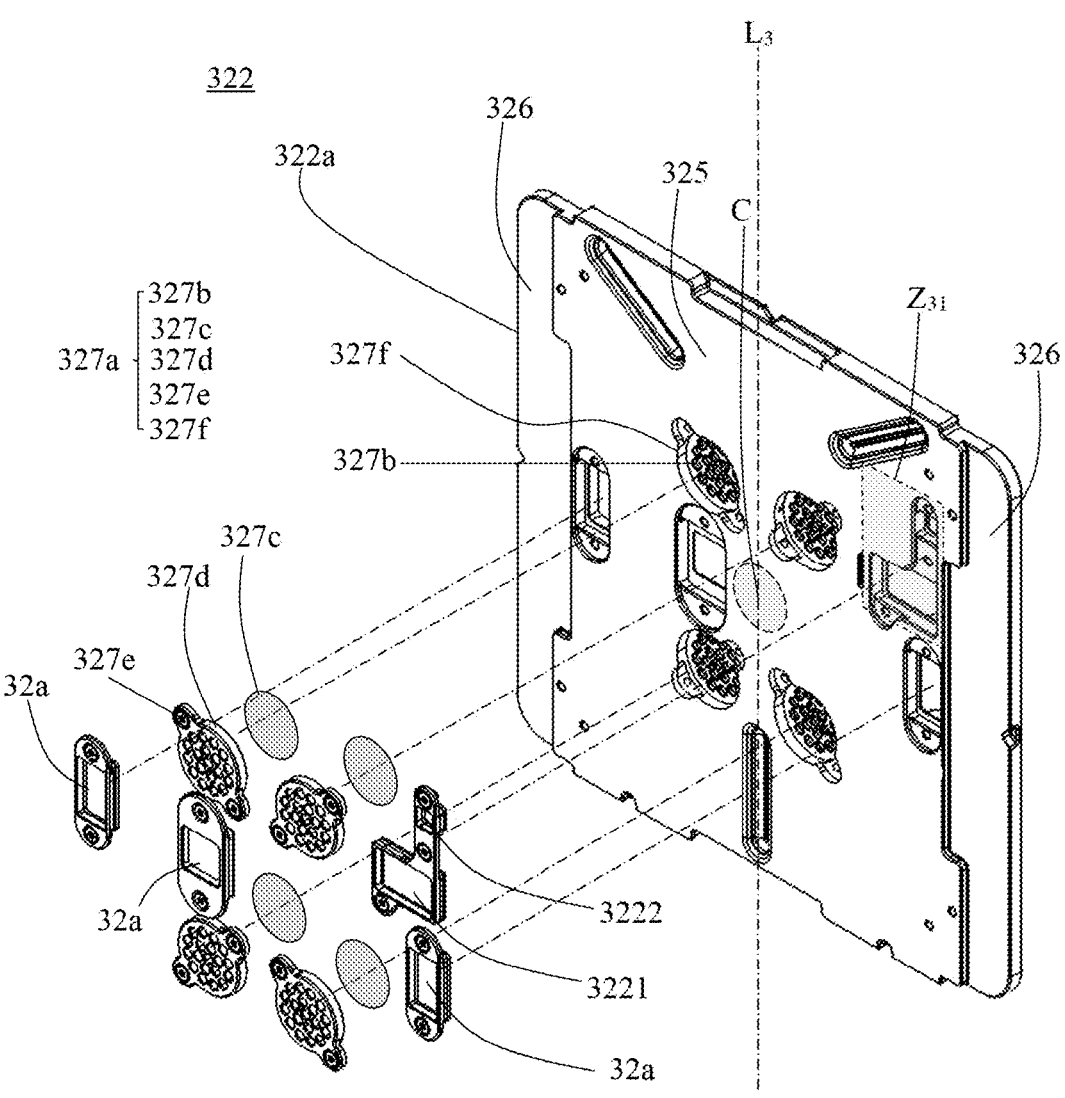
FIG. 3 illustrates an isometric exploded view of a seat member in accordance with some embodiment of the instant disclosure.

FIG. 3 illustrates an isometric exploded view of a seat member in accordance with some embodiment of the instant disclosure. For illustrational simplicity and clarity, some detail/sub components of the exemplary device are not explicitly labeled in the instant figure.

In the illustrated embodiment, the seat member 322 comprises a main body 322a that has a storage portion 325 defining a longitudinal axis $L_3$ through a geometric center region C thereof. The main body 322a further comprises a pair of flank portions 326 that extend along the longitudinal axis $L_3$, each having a reduced thickness (i.e., thinner than that of the storage portion 325). The material, surface treatment, and/or coating arrangements described in previous embodiments may be applied to the exemplary seat member 322.

Figure 13:
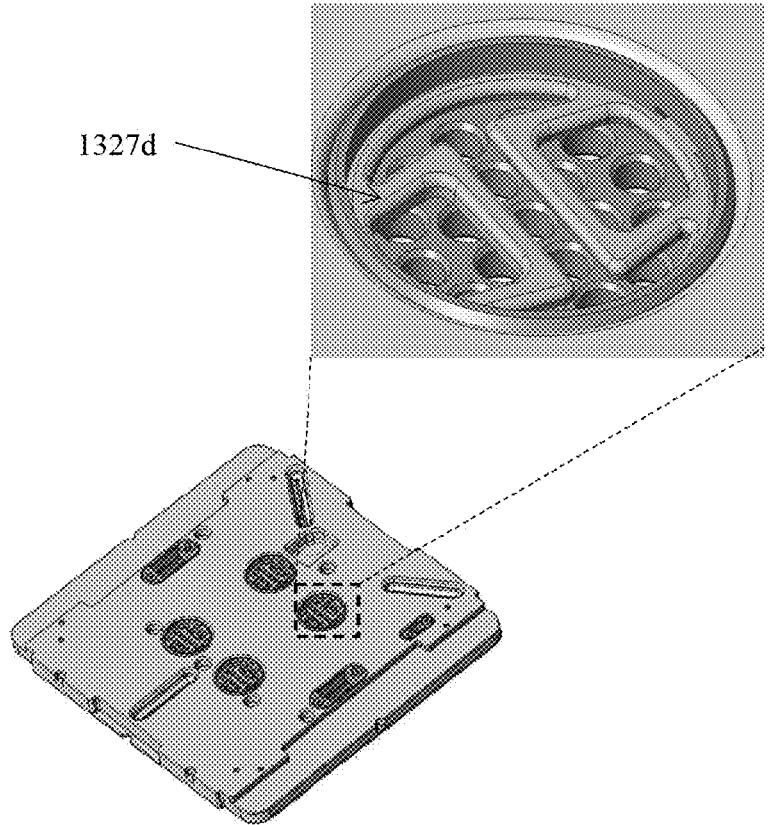
FIG. 13 respectively illustrate a schematic view of a seat member in accordance with some embodiment of the instant disclosure.

The exemplary seat member 322 comprises a plurality of diffuse port assemblies 327a arranged on a bottom face of the main body 322a. In the illustrated embodiment, the diffuse port assembly 327a includes a plurality of ports 327b arranged through the main body 322a and a filter membrane 327c configured to cover the ports 327b. In the illustrated embodiment, the diffuse port assembly 327a is further provided with a filter cover (e.g., filter cover 327d) configured to retain the filter membrane 327c. The exemplary filter cover 327d is made of a perforated plate provided with a planar area comparable to the filter membrane 327c. In some embodiments, the filter cover may be fastened on the bottom face of the seat member 322 through a snap-fit assembly (e.g., having a latch member 1327d as shown in FIG. 13). In the illustrated embodiment, the diffuse port assembly 327a is further provided with a cover retaining member 327e (such as screws) configured to fasten the filter cover 327d on to the bottom face of the seat member 322.

The configuration of the diffuse port assemblies 327a on the main body 322a of the seat member 322 may take various factors into consideration, such as the overall flatness of the outer surface (e.g., bottom face) of the seat member 322 upon assembly. For example, the exemplary filter cover 327d is configured to be embedded in the main body 322a, such that an outwardly-facing surface of the filter cover 327d does not protrude from the bottom face of the seat member 322. In the illustrated embodiment, the diffuse port assembly 327a is provided with a recess feature 327f on the bottom face of the main body 322a of the seat member 322, which is configured to accommodate the filter cover 327d. In some embodiment, the provision of the recess features 327f also serves a weight-shaving measure that reduces the overall mass of the main body 322a.

The material for the seat member may take various factors into consideration, such as the ambient environment to which it exposes to (e.g., the condition inside an exposure device). For one thing, conventional filter components often contain certain base materials (e.g., Teflon/PTFE). However, in certain delicate applications (e.g., EUV lithography process), exposure of certain content in the filter element to extreme ambient condition (e.g., EUV emission) may result in the generation of undesirable byproduct (e.g., outgas) detrimental to the fabrication process. In some embodiments, the lower filter membrane (e.g., filter membrane 327c) is substantially free of fluorine content. In some embodiments, the filter membrane may be substantially made from metallic material, such as nickel. In some embodiments, the metallic filter membrane may be fabricated by electroforming process. In some embodiments, the filter cover and the cover fastener are also substantially free of fluorine content. Suitable materials for the filter cover and the cover fastener may be metal, such as aluminum.

As shown in the instant figure, the seat member 322 is provided with a first observable zone $Z_{31}$ within the storage portion 325 to allow observation of a received substrate. In the illustrated embodiment, the seat member 322 includes two inner optical members 3221, 3222 embedded in the first observable zone $Z_{31}$. In some embodiments, the inner optical member 3221/3222 may be sealingly installed in the first observable zone $Z_{31}$. For example, the construction of the inner optical member 3221/3222 may include a sealing member around the optically transmissive member (e.g., O-ring). In general, the construction of the inner optical member 3221/3222 provides a sealing enclosure capable of sufficiently preventing dust and humidity from entering into the interior volume through the structural interface between the optical member and the seat member. In some embodiments, the optical member 3221/3222 may be constructed to achieve airtight level sealing. In some embodiments, suitable material of two inner optical members 3221, 3222 may be comparable to those described in the previous embodiments.

Figure 4A:
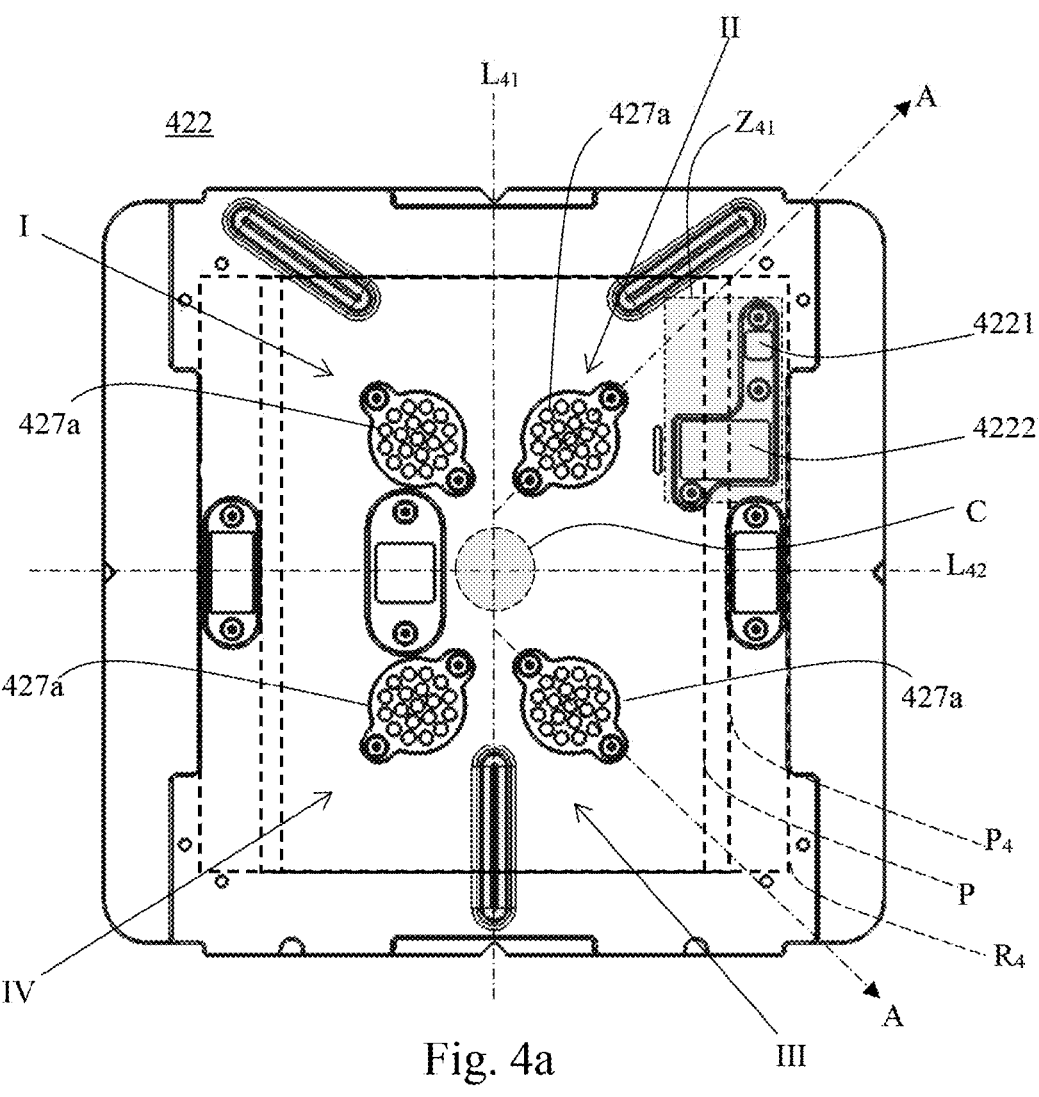
FIG. 4a illustrates a bottom view of a seat member in accordance with some embodiment of the instant disclosure.
Figure 4B:
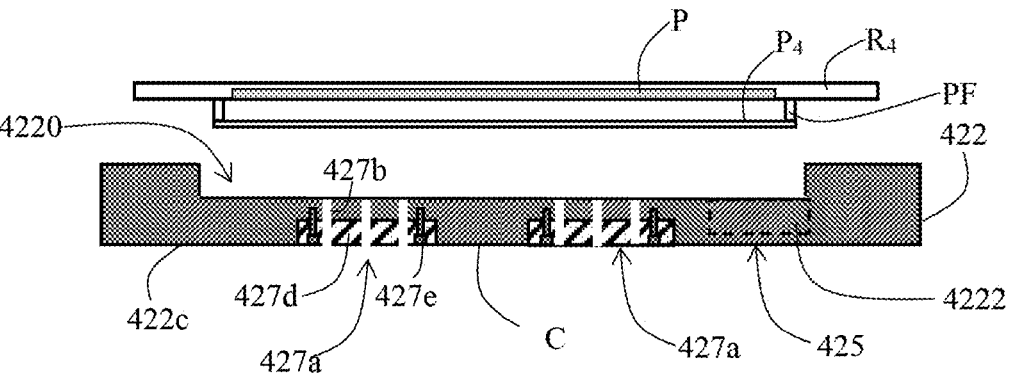
FIG. 4b illustrates a schematic cross-sectional view of a seat member in accordance with some embodiment of the instant disclosure.

FIG. 4a illustrates a bottom view of a seat member in accordance with some embodiment of the instant disclosure. FIG. 4b illustrates a schematic cross-sectional view of a seat member in accordance with some embodiment of the instant disclosure. FIG. 4b may be a schematic cross-sectional view along A-A shown in FIG. 4a. For illustrational simplicity and clarity, some detail/sub components of the exemplary device are not explicitly labeled in the instant figure.

In the illustrated embodiment, the seat member 422 is configured to receive a reticle $R_4$ that has a pattern area P and a pellicle $P_4$. In the current view, the exemplary storage portion 425 of the seat member 422 is provided with a trough (e.g., weight shaving region 4220) configured to accommodate a pellicle $P_4$ of a received reticle $R_4$. The weight shaving region 4220 is arranged in correspondence with projections of the pattern region P and the pellicle $P_4$. In the illustrated embodiment, the diffuse port assemblies 427a are arranged within the weight shaving region 4220. Such arrangement allows extraction or removal of the gas under the pattern area P and the pellicle $P_4$ inside the storage assembly, thereby alleviating water condensation and/or haze formation on the pellicle $P_4$. Besides, the seat member 422 is provided with a substantially flat bottom face. In the current cut view, the filter cover 427d and the cover retaining member 427e stay substantially flush with an outer surface (e.g., bottom face 422c) of the seat member 422 upon assembly.

In some embodiments, at least one of the diffuse port assemblies is arranged in a respective quadrantal region (e.g., regions I, II, III, IV) around the geometric center region C of the storage portion. For example, the exemplary seat member 422 is shown to possess two perpendicular bisectors $Z_{41}$, $Z_{42}$ that substantially divided the seat member 422 into four quadrantal regions I, II, III, IV. The exemplary seat member 422 comprises four diffuse port assemblies 427a respectively arranged in the four quadrantal regions. Such a layout arrangement may help to retain better overall balance of the storage portion 425 while maintaining structural integrity. The somewhat even and symmetrical distributing layout may also help to generate a more uniform diffusion effect.

In the illustrated embodiment, the seat member 422 comprises a first observation zone $Z_{41}$ that is provided with two inner optical members 4221, 4222. The inner optical member 4221 has a greater planar area than inner optical member 4222. In the current cut view, the inner optical members 4222 that has larger planar is arranged projectively overlapping with the received reticle $R_4$, pellicle $P_4$, and pellicle frame PF. Confirmation on information, such as the condition, status and/or identification of the received reticle $R_4$, pellicle $P_4$, pellicle frame PF, may be achieved simply via scanning/observing through the outer observable zone (e.g., second observation zone $Z_{12}$ shown in FIG. 1) and the first observable zone $Z_{41}$, thereby reducing the number of times the outer pod has to be opened. In some embodiments, a visual graphical feature (not shown) may be further provided on bottom face of the seat member 422 arranged between the two inner optical members 4221, 4222. Visual graphical feature may include a two-dimensional bar code such as a quick response code (QR code) representing the identity of the inner pod and an asymmetric pattern for indicating the orientation of storage assembly.

In the current cut view, the exemplary diffuse port 427b is provided with a substantially uniform width. However, the cross-sectional configuration of the diffuse ports may take many factors into consideration such as the direction of air flowing there-through. For example, a diffuse port provided with downward gradually decreasing width may facilitate an outward flow of air. On the contrary, a diffuse port having downwardly gradually increasing width may facilitate an inward air flow. In some embodiments, the diffuse ports may be provided with a tapered up/down cross-sectional profile.

Figure 5A:
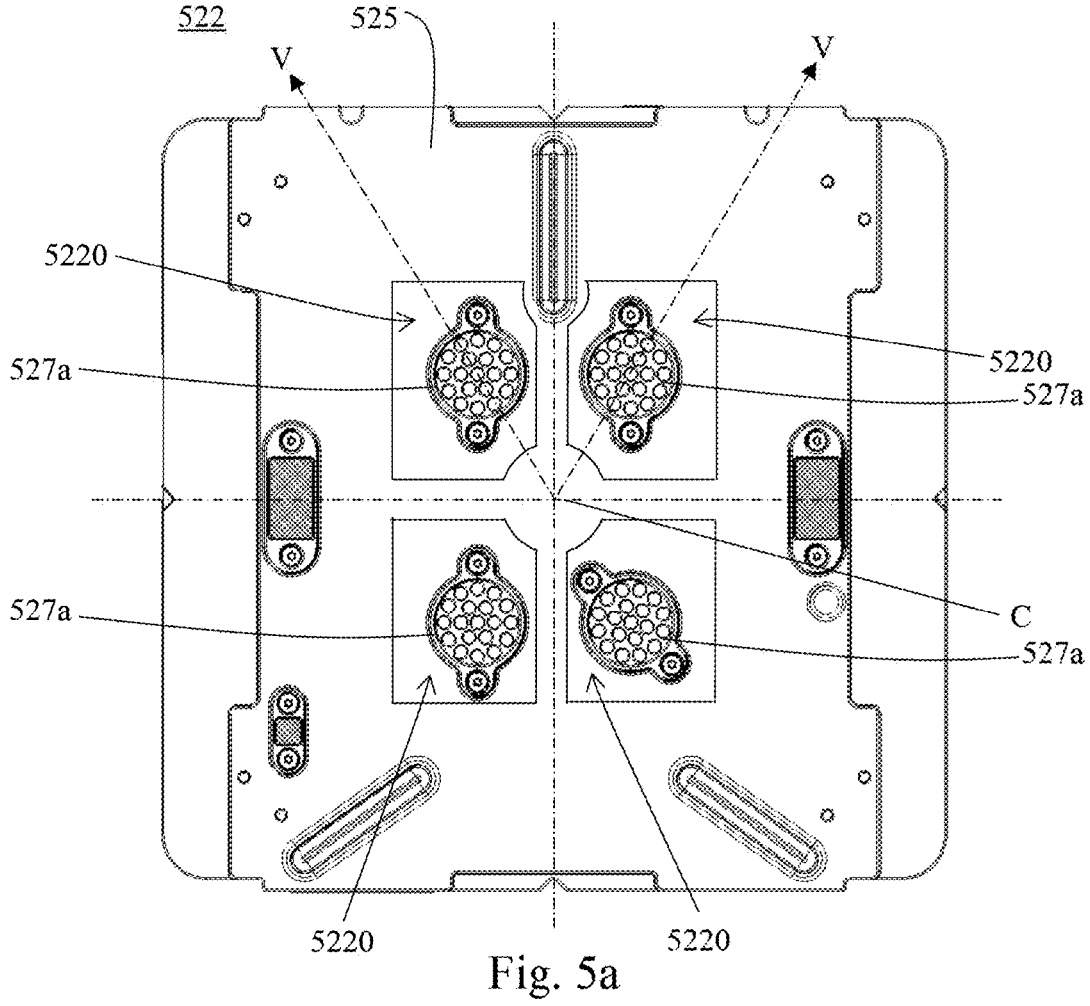
FIG. 5a illustrates a bottom view of a seat member in accordance with some embodiment of the instant disclosure.
Figure 5B:
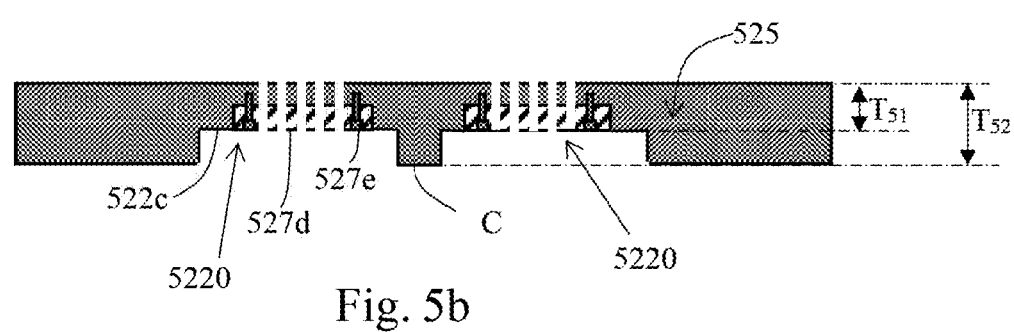
FIG. 5b illustrates a schematic cross-sectional view of a seat member in accordance with some embodiment of the instant disclosure.

FIG. 5a illustrates a bottom view of a seat member in accordance with some embodiment of the instant disclosure. FIG. 5b illustrates a schematic cross-sectional view of a seat member in accordance with some embodiment of the instant disclosure. FIG. 5b may be a schematic cross-sectional view along V-V shown in FIG. 5a. For illustrational simplicity and clarity, some detail/sub components of the exemplary device are not explicitly labeled in the instant figure.

Besides the uniformity of the interior gas diffusion, the weight distribution, structural integrity and the overall weight limit of the device components may be take into consideration. In the bottom view, the seat member 522 comprises a storage portion 525 that is provided with a plurality of weight shaving regions 5220 respectively arranged in each of the quadrantal regions around the geometric center region C of the seat member 522. As shown in FIG. 5b, a thickness $T_{51}$ of the exemplary seat member 522 in the weight shaving region 5220 is thinner than that (i.e., thickness $T_{52}$) in the geometric center region C. The filter cover 527d and the cover retaining member 527e stay substantially flush with an outer surface 522c of the seat member 522 upon assembly.

Such a layout arrangement may help to retain better overall balance of the main body of the seat member while maintaining structural integrity and overall weight limit. In some embodiments, at least one of the diffuse port assemblies is arranged in a respective weight shaving regions 5220. For example, the seat member 522 comprises four diffuse port assemblies 527a arranged respectively in the weight shaving regions 5220.

Figure 6A:
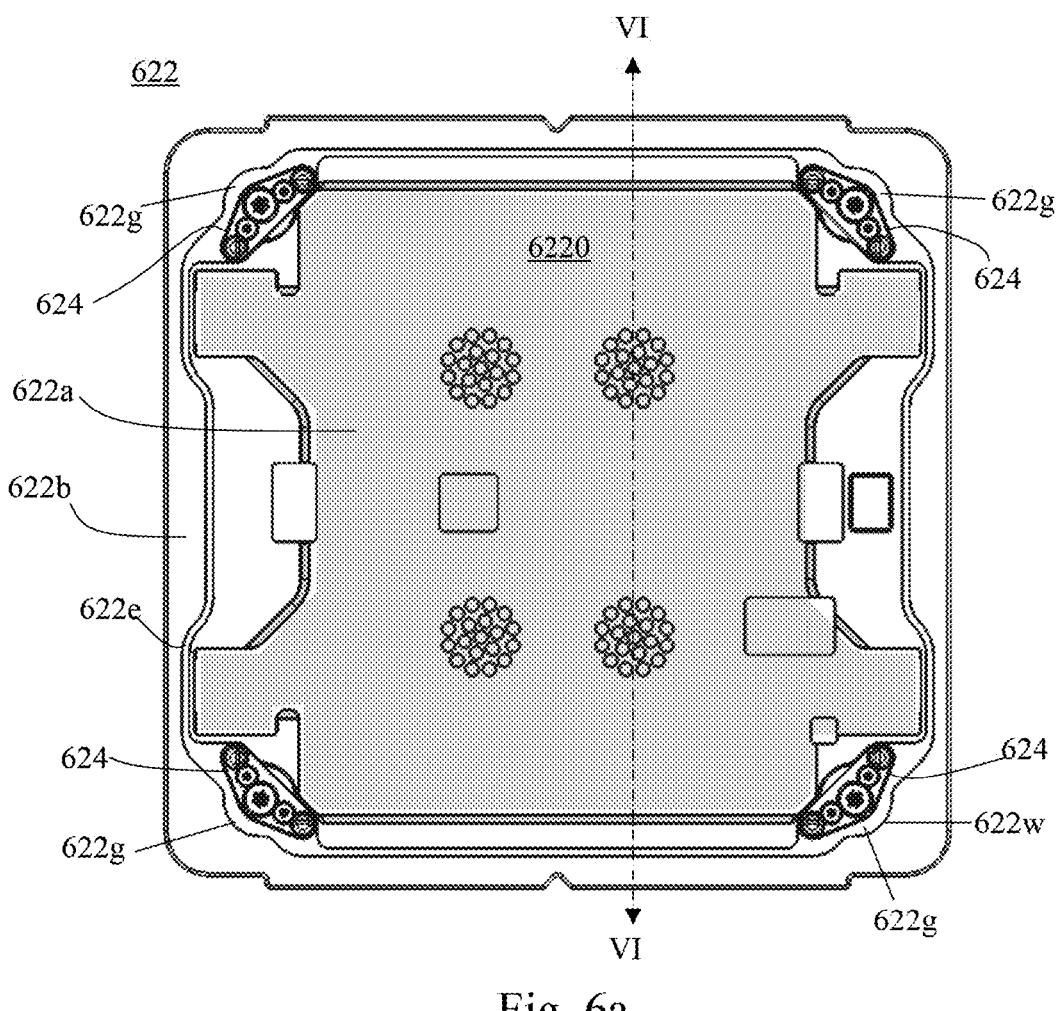
FIG. 6a illustrates a top view of a seat member in accordance with some embodiment of the instant disclosure.
Figure 6B:
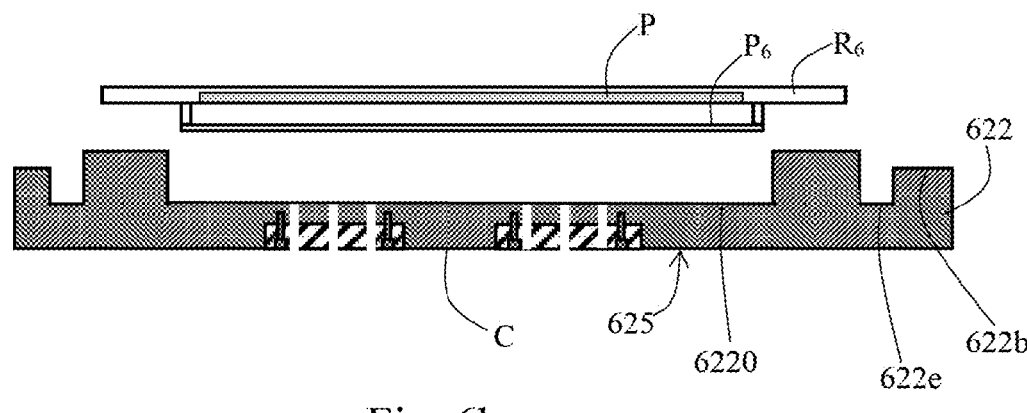
FIG. 6b illustrates a schematic cross-sectional view of a seat member in accordance with some embodiment of the instant disclosure.

FIG. 6a illustrates a top view of a seat member in accordance with some embodiment of the instant disclosure. FIG. 6b illustrates a schematic cross-sectional view of a seat member in accordance with some embodiment of the instant disclosure. FIG. 6b may be a schematic cross-sectional view along VI-VI shown in FIG. 6a.

In FIG. 6a, the seat member 622 is provided with a workpiece receiving region 622a and a periphery region 622b surrounding the workpiece receiving region 622a. The top surface of the periphery region 622b is configured to form a surface to surface contact with a seat cover so as to establish an air-tight sealing. In some scenarios, the air-tight sealing may not achieve a desired level due to process variation issues (such as surface treatment errors). Contaminants such as particles may thus be able to enter the storage assembly.

In the illustrated embodiment, the seat member 622 is further provided with a trench structure 622*e* having a planar loop profile that encloses the workpiece receiving region 622*a*. Particulate contaminants entering the storage assembly may be trapped or captured within the trench structure 622*e*.

In the current top view, the seat member 622 is provided with a plurality of positioning structures 624 protrudingly arranged around respective corners of the workpiece receiving region 622*a*. The exemplary trench structure 622*e* comprises a plurality of guide trench segments 622*g* respectively encompassing the positioning structures 624. In the illustrated embodiment, a wall 622*w* that defines the guide trench segments 622*g* has rounded contour for a planar profile. In some embodiments, a portion of the wall 622*w* of the guide trench structure closest to the inner region (e.g., workpiece receiving region 622*a*) has a rounded planar profile configured to guide the direction of intruding particles (e.g., vacuumed into the base) right back out of the seat member 622. In some embodiments, the wall(s) of guide trench structure may be formed by a combination of a plurality of arc shaped sections continuously coupled to each other.

In the current cut view, the storage portion 625 of the seat member 622 is provided with a weight shaving region 6220 within the workpiece receiving region 622*a*. The weight shaving region 6220 has a trough arranged in correspondence with a projection of the pattern region P of the substrate R$_6$. In the current top view, the seat member is provided with four diffuse port assemblies arranged in the weight shaving region 6220 (indicated by shaded region).

Figure 7:
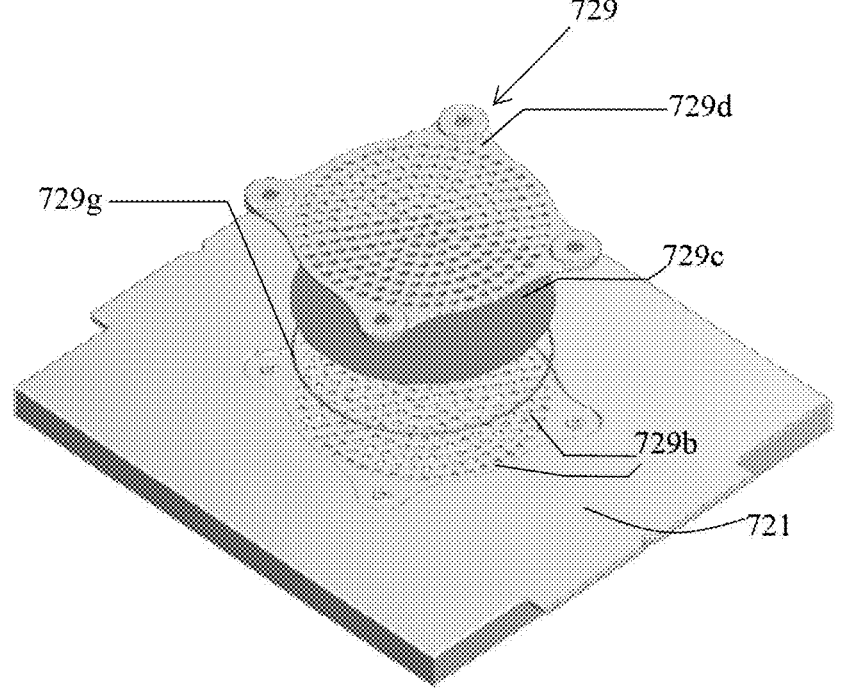
FIG. 7 illustrates an isometric exploded view of a seat cover in accordance with some embodiment of the instant disclosure.

FIG. 7 an isometric exploded view of a seat cover in accordance with some embodiment of the instant disclosure.

In the illustrated embodiment, the seat cover 721 is provided with an upper diffuse inducing component 729. The exemplary upper diffuse inducing component 729 comprises a plurality of ports 729*b* arranged through the seat cover 721, an upper filter membrane 729*c*, and a filter cover 729*d* provided with a perforated plate. In some embodiments, the upper filter membrane 729*c* has substantially different material composition than the lower filter membrane (e.g., filter membrane 327 shown in FIG. 3). For example, the upper filter membrane 729*c* may comprise a fabric-based material, and the lower filter membrane (e.g., filter membrane 329*c*) is substaintailly free of fluorine content.

In the illustrated embodiment, the upper diffuse inducing component 729 is further provided with a sealing member for enhancing the sealing engagement between the filter cover 729*d* and the seat cover 721. For example, the filter module 729 further comprises a sealing ring 729*g* arranged between the periphery of the filter cover 729*d* and the seat cover 721. In some embodiments, the periphery of the filter cover 729*d* may be formed with a downward facing annular groove for accommodating the sealing ring 729*g*.

In some embodiments, the upper diffuse inducing component 729 is arranged projectively overlaps the lower diffuse inducing component (e.g., the diffuse port assemblies 527*a*).

FIGS. 8*a* to 8*e* respectively illustrates a schematic view of a seat member in accordance with various embodiments of the instant disclosure.

Figure 8A:
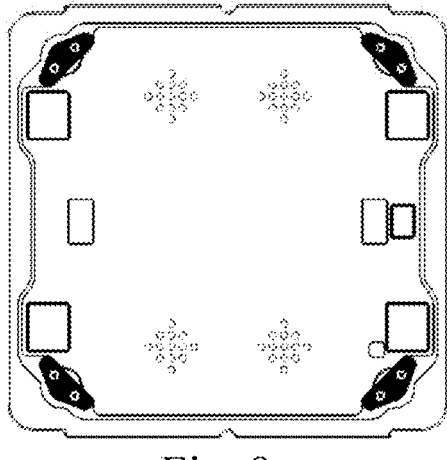
FIGS. 8a to 8e respectively illustrates a schematic view of a seat member in accordance with some embodiment of the instant disclosure.
Figure 8B:
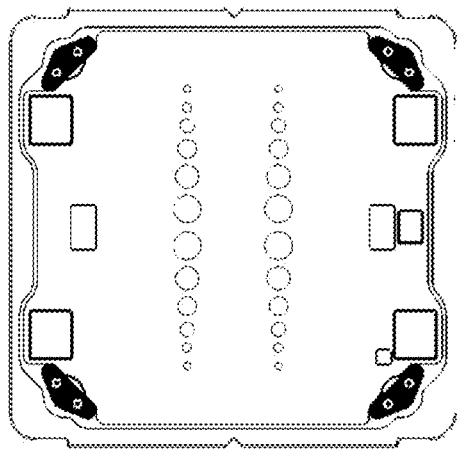
Figure 8C:
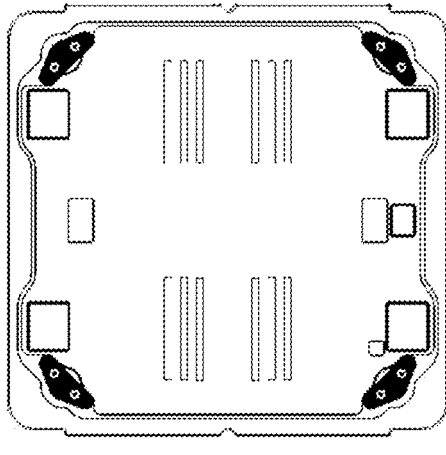
Figure 8D:
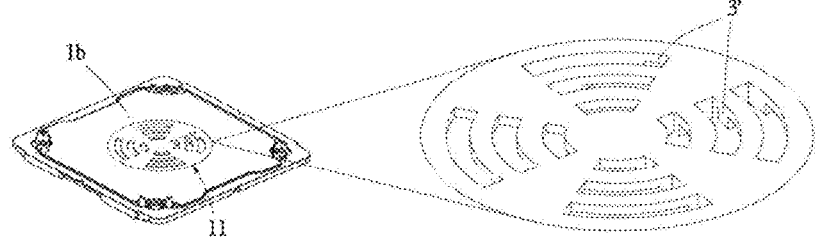
Figure 8E:
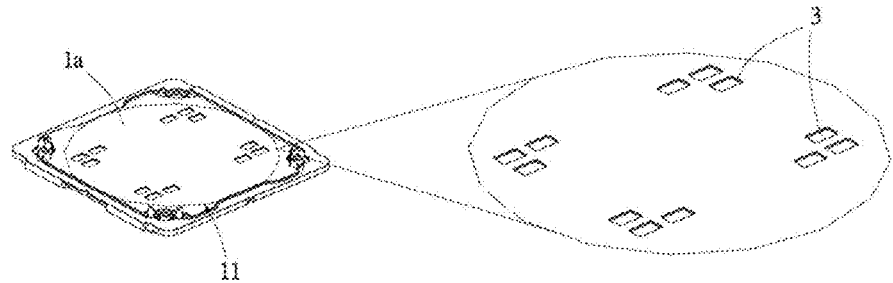

The shape, size, and the arrangement of the diffuse ports formed on the seat member need not be limited, as long as the diffuse port assemblies offset the center region of the seat member. For example, the exemplary diffuse ports shown in FIG. 8*a* and FIG. 8*b* are provided with a rounded contour for a planar profile. However, the diffuse ports in FIG. 8*c* and FIG. 8*d* are provided with elongated planar contour. The elongated diffuse ports in FIG. 8*d* are provided with a curvature. The diffuse ports in FIG. 8*e* are provided with rectangular planar contour.

Figure 9A:
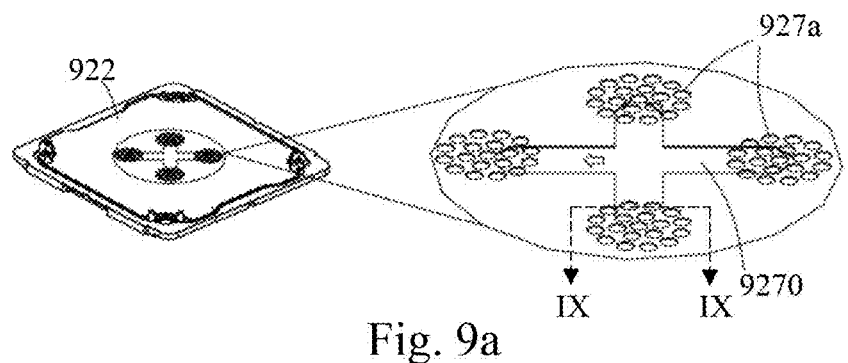
FIG. 9a illustrates a schematic view of a seat member in accordance with some embodiment of the instant disclosure.
Figure 9B:
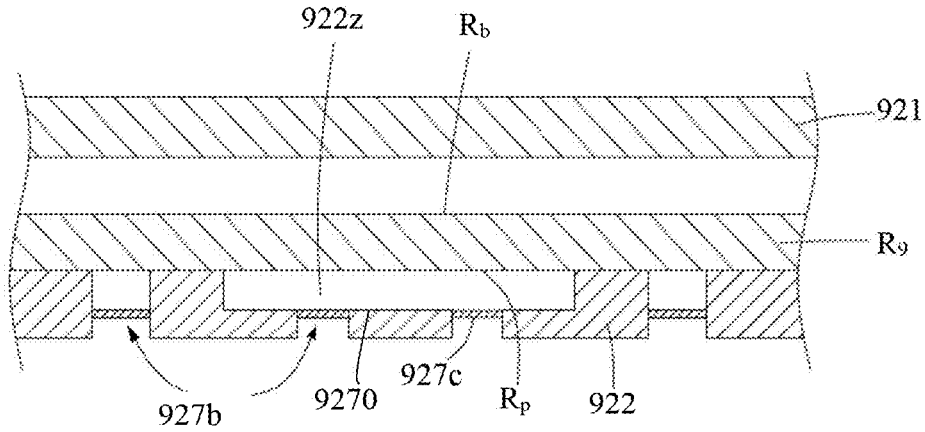
FIG. 9b illustrates a schematic cross-sectional view of a seat member in accordance with some embodiment of the instant disclosure.

FIG. 9*a* illustrates a schematic view of a seat member in accordance with some embodiment of the instant disclosure. FIG. 9*b* illustrates a schematic cross-sectional view of a seat member in accordance with some embodiment of the instant disclosure. FIG. 9*b* may be a schematic cross-sectional view along IX-IX shown in FIG. 9*a*.

In some embodiments, the diffuse inducing component of the seat member may be further provided with one or more air guiding channel that fluidly connects adjacent diffuse port assemblies upon engaging. For example, the exemplary seat member 922 shown in FIG. 9*a* is provided with a recess structure 9270 having a cross planar contour. Four end portions of the recess structure 9270 are arranged projectively overlapped the four diffuse port assemblies 927*a*.

In the FIG. 9*b*, a reticle R$_9$ stored over a seat member 922 is covered by a seat cover 921. The seat cover 921 is engaged with and the seat member 922. The seat member 922 is provided with a pluralities of diffuse ports 927*b* and filter membranes 927*c*. In the current cut view, a bottom face (provided with pattern area) R$_p$ and the recess structure 9270 cooperatively defines a channel that fluidly connects adjacent diffuse ports 927*b*. Such arrangement allows the extraction or reduction of gas phase containment such as moisture inside the channel through the adjacent diffuse port assemblies 927*b*.

Figure 10A:
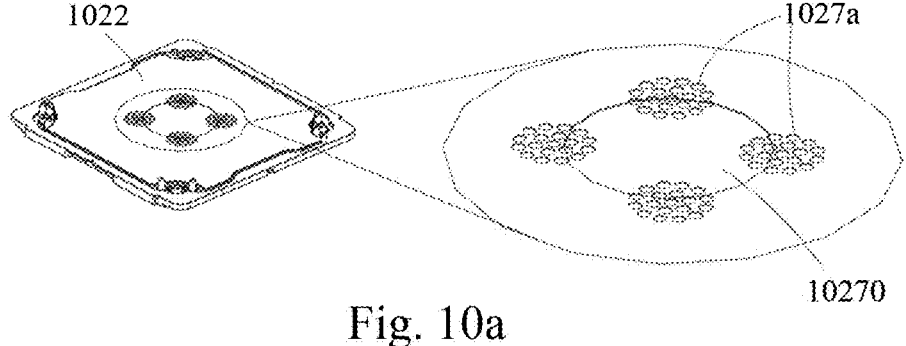
FIGS. 10a to 10b respectively illustrates a schematic cross-sectional view of a seat member in accordance with some embodiments of the instant disclosure.
Figure 10B:
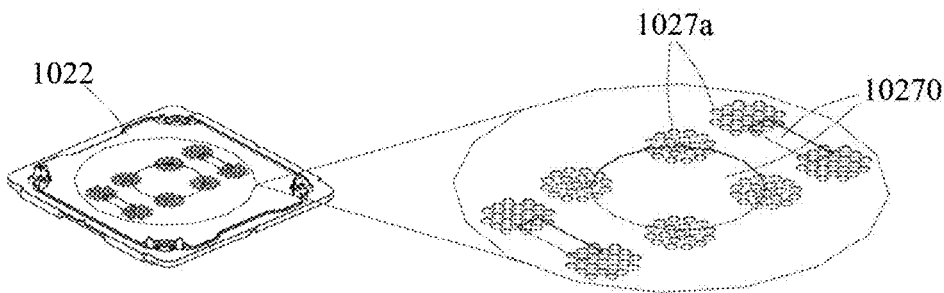

FIGS. 10*a* to 10*b* respectively illustrates a schematic view of a seat member in accordance with some embodiment of the instant disclosure.

The shape, size, and the arrangement of the air guiding channel of the diffuse inducing component need not be limited, as long as the air guiding channel is in fluid connection with adjacent diffuse port assemblies. For example, in FIG. 10*a*, the seat member 1022 is provided with a recess structure 10270 having a rounded planar profile. A periphery region of the recess structure 10270 overlaps the diffuse port assemblies 1027*a*. In the embodiment illustrated in FIG. 10*b*, the seat member is provided with three recess structures 10270.

Figure 11A:
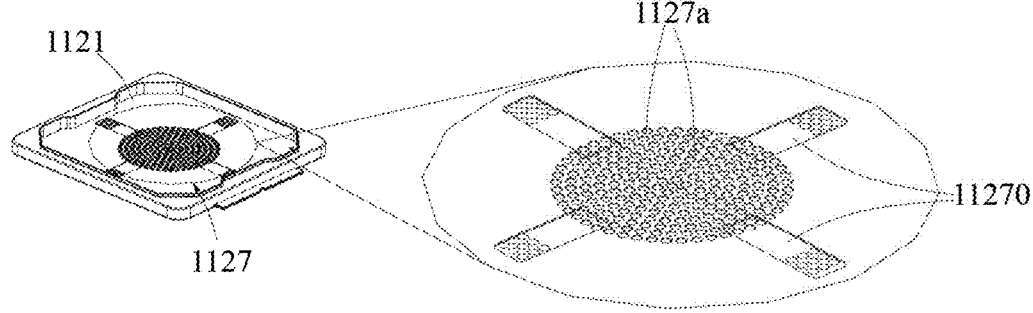
FIG. 11a to 11b respectively illustrates a schematic view of a seat cover in accordance with some embodiment of the instant disclosure.
Figure 11B:
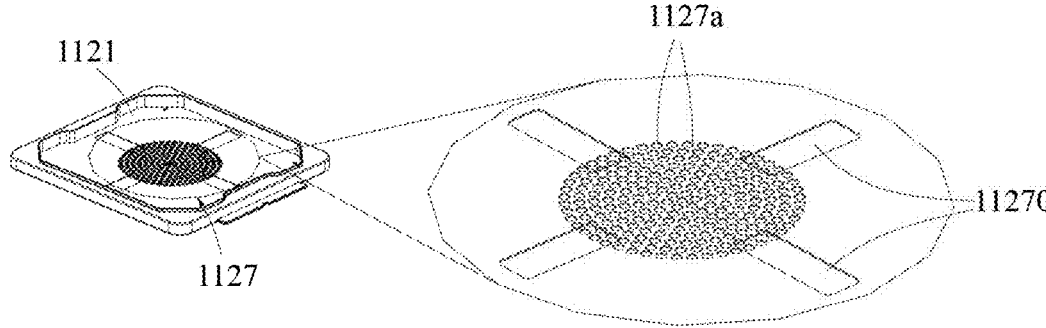

FIGS. 11*a* and 11*b* respectively illustrates a schematic view of a schematic view of a seat cover in accordance with some embodiment of the instant disclosure.

In some embodiments, the upper diffuse inducing component of the seat cover may be further provided with air guiding channel comparable to that of the lower diffuse inducing component. For example, the upper diffuse inducing component 1127 of the seat cover 1121 shown in FIGS. 11*a* and 11*b* is provided with one or more recess structure 10270 that projectively overlaps the diffuse port assemblies 1027*a*.

Figure 12A:
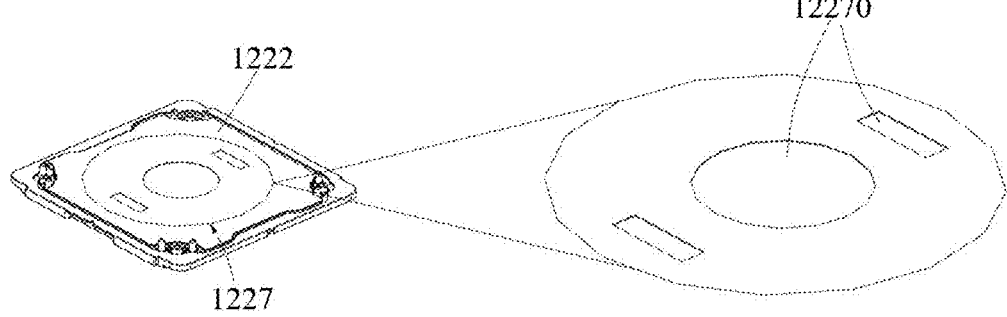
FIGS. 12a to 12b respectively illustrates a schematic view of a seat member in accordance with some embodiment of the instant disclosure.
Figure 12B:
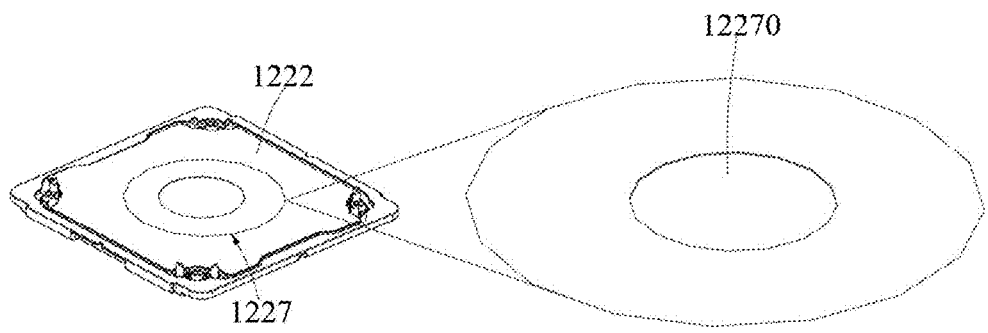

FIGS. 12*a* to 12*b* respectively illustrates a schematic view of a seat member in accordance with some embodiment of the instant disclosure.

In FIG. 12*a*, the lower diffuse inducing component 1227 of the seat member 1222 is provided with three recess structures 12270. In the embodiment shown in FIG. 12*b*, the lower diffuse inducing component 1227 is provided with one recess structures 12270.

Accordingly, one aspect of the instant disclosure provides a workpiece container system comprising a storage assembly that comprises a seat member. The seat member has a storage portion that defines a longitudinal axis through a geometric center region thereof, provided with a workpiece receiving region that encompasses the geometric center region and configured to receive a workpiece. The seat member has a pair of flank portions arranged on opposite sides of the storage portion along the longitudinal axis, each having a thickness thinner than that of the storage portion. A diffuse inducing component is provided on the storage portion in the workpiece receiving region yet offsets the geometric center region thereof.

In some embodiments, the workpiece receiving region is configured to receive a substrate with a pattern region. The diffuse inducing component is provided within a planar projection of the pattern region.

In some embodiments, the diffuse inducing component comprises a plurality of diffuse port assemblies arranged in the workpiece receiving region around the geometric center region of the storage portion.

In some embodiments, the diffuse port assembly includes a filter cover and a cover retaining member. The filter cover and the cover retaining member stay substantially flush with an outer surface of the seat member upon assembly.

In some embodiments, the diffuse port assembly further comprises a filter membrane configured to be retained by the filter cover. The filter membrane is substantially free of fluorine content.

In some embodiments, at least one of the diffuse port assemblies is arranged in a respective quadrantal region around the geometric center region of the storage portion.

In some embodiments, the storage portion of the seat member is provided with a plurality of weight shaving regions respectively arranged in each of the quadrantal regions around the geometric center region. A thickness of the seat member in the weight shaving region is thinner than that in the geometric center region. The diffuse port assemblies are arranged respectively in the weight shaving regions.

In some embodiments, the storage portion of the seat member is provided with a weight shaving region arranged in correspondence with a projection of the pattern region. The diffuse port assemblies are arranged in the weight shaving region.

In some embodiments, the seat member is provided with a trench structure having a planar loop profile that encloses the workpiece receiving region.

In some embodiments, the seat member is further provided with a plurality of positioning structures protrudingly arranged around respective corners of the workpiece receiving region. The trench structure comprises a plurality of guide trench segments respectively encompassing the positioning structures.

Accordingly, one aspect of the instant disclosure provides a workpiece container system comprising a storage assembly that comprises a seat member and a seat cover. The seat member that defines a workpiece receiving region that encompasses a geometric center region thereof, configured to receive a substrate with a pattern region. A lower diffuse inducing component is provided on the seat member within a planar projection of the pattern region of the substrate yet offsets the geometric center region. The seat cover configured to engage the seat member at a periphery region around the workpiece receiving region thereof, configured to cooperatively form an enclosure for housing the substrate.

In some embodiments, the lower diffuse inducing component comprises a plurality of diffuse port assemblies arranged in the workpiece receiving region around the geometric center region.

In some embodiments, the diffuse port assembly includes a filter cover, a lower filter membrane configured to be retained by the filter cover, and a cover retaining member. The filter cover and the cover retaining member stay substantially flush with an outer surface of the seat member upon assembly.

In some embodiments, the lower filter membrane is substantially free of fluorine content.

In some embodiments, the seat cover is provided with an upper diffuse inducing component projectively overlaps the lower diffuse inducing component. The upper diffuse inducing component is provided with an upper filter membrane having substantially different material composition than the lower filter membrane.

In some embodiments, the upper filter membrane comprises a fabric-based material. The lower filter membrane comprises a metallic material.

In some embodiments, at least one of the diffuse port assemblies is arranged in a respective quadrantal region around the geometric center region.

In some embodiments, the seat member is provided with a plurality of weight shaving regions respectively arranged in each of the quadrantal regions around the geometric center region. A thickness of the seat member in the weight shaving region is thinner than that in the geometric center region. The diffuse port assemblies are arranged respectively in the weight shaving regions.

In some embodiments, the seat member is provided with a weight shaving region arranged in correspondence with a projection of the pattern region of the substrate. The diffuse port assemblies are arranged in the weight shaving region.

In some embodiments, the system further comprising a transport assembly configured to enclose the storage assembly while enable optical observation of the seat member of the storage assembly.

The embodiments shown and described above are only examples. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:
1. A workpiece container system, comprising:
a storage assembly that comprises:
a seat member having:
a storage portion that defines a longitudinal axis through a geometric center region of the seat member, the storage portion having a workpiece receiving region encompassing the geometric center region and configured to receive a workpiece and support the workpiece from below; and
a pair of flank portions arranged on opposite sides of the storage portion along the longitudinal axis, each flank portion having a thickness thinner than a thickness of the storage portion to generate a step profile near an edge portion of the seat member, a pair of stepped profiles, including the step profile, configured to serve as contact interfaces with a robot arm having a fork-like structure, wherein:

a diffuse inducing component for outward diffusion is provided on the storage portion and in the workpiece receiving region, the diffuse inducing component offsets the geometric center region of the seat member, the diffuse inducing component allows a diffusion of moisture from inside the storage assembly to outside ambience, the diffuse inducing component comprises a plurality of diffuse port assemblies arranged in the workpiece receiving region around the geometric center region, each of the plurality of diffuse port assemblies comprises a through hole formed on the storage portion, and when a reticle with a pattern region is received by the workpiece receiving region, all of the plurality of diffuse port assemblies are aligned with the pattern region of the reticle along a vertical direction, with a gap between the plurality of diffuse port assemblies and the pattern region of the reticle.

2. The workpiece container system of claim 1, wherein:

the diffuse port assembly comprises a filter cover and a cover retaining member, and the filter cover and the cover retaining member stay substantially flush with an outer surface of the seat member upon assembly.

3. The workpiece container system of claim 2, wherein:

the diffuse port assembly further comprises a filter membrane configured to be retained by the filter cover, and the filter membrane is substantially free of fluorine content.

4. The workpiece container system of claim 1, wherein at least one of the plurality of diffuse port assemblies is arranged in a respective quadrantal region around the geometric center region.

5. The workpiece container system of claim 4, wherein:

the storage portion of the seat member has a plurality of weight shaving regions respectively arranged in each of the quadrantal regions around the geometric center region, a thickness of the seat member in the weight shaving region is thinner than that in the geometric center region, and the plurality of diffuse port assemblies is arranged respectively in the weight shaving regions.

6. The workpiece container system of claim 4, wherein:

the storage portion of the seat member has a weight shaving region, when the substrate with the pattern region is received by the workpiece receiving region, the weight shaving region is aligned with the pattern region of the substrate along the vertical direction, and the plurality of diffuse port assemblies is arranged in the weight shaving region.

7. The workpiece container system of claim 1, wherein the seat member has a trench structure having a planar loop profile that encloses the workpiece receiving region.

8. The workpiece container system of claim 7, wherein:

the seat member further has a plurality of positioning structures protrudingly arranged around respective corners of the workpiece receiving region, and the trench structure comprises a plurality of guide trench segments respectively encompassing the positioning structures.

9. A workpiece container system, comprising:

a storage assembly that comprises:

a seat member having:

a storage portion that defines a longitudinal axis through a geometric center region of the seat member, the storage portion having a workpiece receiving region encompassing the geometric center region and configured to receive a workpiece and support the workpiece from below; and a pair of flank portions arranged on opposite sides of the storage portion along the longitudinal axis, each flank portion having a thickness thinner than a thickness of the storage portion to generate a step profile near an edge portion of the seat member, a pair of stepped profiles, including the step profile, configured to serve as contact interfaces with a robot arm having a fork-like structure, wherein:

a lower diffuse inducing component for outward diffusion is provided on the storage portion and in the workpiece receiving region, the lower diffuse inducing component allows a diffusion of moisture from inside the storage assembly to outside ambience;

the lower diffuse inducing component offsets the geometric center region;

the lower diffuse inducing component comprises a plurality of diffuse port assemblies arranged in the workpiece receiving region around the geometric center region, each of the plurality of diffuse port assemblies comprises a through hole formed on the storage portion; and when a substrate with a pattern region is received by the workpiece receiving region, all of the plurality of diffuse port assemblies are aligned with the pattern region of the substrate along a vertical direction, with a gap between the plurality of diffuse port assemblies and the pattern region of the substrate; and a seat cover configured to engage the seat member from above at a periphery region around the workpiece receiving region and configured to cooperatively form an enclosure for housing the workpiece received by the seat member.

10. The workpiece container system of claim 9, wherein:

each diffuse port assembly, among the plurality of diffuse port assemblies, includes a filter cover, a lower filter membrane configured to be retained by the filter cover, and a cover retaining member, and the filter cover and the cover retaining member stay substantially flush with an outer surface of the seat member upon assembly.

11. The workpiece container system of claim 10, wherein the lower filter membrane is substantially free of fluorine content.

12. The workpiece container system of claim 11, wherein:

the seat cover has an upper diffuse inducing component projectively overlaps the lower diffuse inducing component, and the upper diffuse inducing component has an upper filter membrane having substantially different material composition than the lower filter membrane.

13. The workpiece container system of claim 12, wherein:

the upper filter membrane comprises a fabric-based material, and the lower filter membrane comprises a metallic material.

14. The workpiece container system of claim 9,
wherein at least one of the plurality of diffuse port
assemblies is arranged in a respective quadrantal region
around the geometric center region.

15. The workpiece container system of claim 14, wherein:
the seat member has a plurality of weight shaving regions
respectively arranged in each of the quadrantal regions
around the geometric center region,
a thickness of the seat member in the weight shaving
region is thinner than that in the geometric center
region, and
the plurality of diffuse port assemblies is arranged respec-
tively in the weight shaving regions.

16. The workpiece container system of claim 14, wherein:
the seat member has a weight shaving region,
when the substrate with the pattern region is received by
the workpiece receiving region, the weight shaving
region is aligned with the pattern region of the substrate
in the vertical direction, and
the plurality of diffuse port assemblies is arranged in the
weight shaving region.

17. The workpiece container system of claim 9, further
comprising:
a transport assembly configured to enclose the storage
assembly while enabling optical observation of the seat
member.

\* \* \* \* \*